United States Patent
Maga et al.

(10) Patent No.: US 12,302,529 B2
(45) Date of Patent: May 13, 2025

(54) COOLING SYSTEM AND COOLING ARRANGEMENT

(71) Applicant: Robert Bosch GmbH, Stuttgart (DE)

(72) Inventors: Iulian Maga, Ludwigsburg (DE); Frank Pelz, Leonberg (DE); Mohamed Lamdiziz, Marbach A. N. (DE)

(73) Assignee: ROBERT BOSCH GMBH, Stuttgart (DE)

( * ) Notice: Subject to any disclaimer, the term of this patent is extended or adjusted under 35 U.S.C. 154(b) by 284 days.

(21) Appl. No.: 17/635,941

(22) PCT Filed: Sep. 18, 2020

(86) PCT No.: PCT/EP2020/076127
§ 371 (c)(1),
(2) Date: Feb. 16, 2022

(87) PCT Pub. No.: WO2021/058397
PCT Pub. Date: Apr. 1, 2021

(65) Prior Publication Data
US 2022/0330456 A1  Oct. 13, 2022

(30) Foreign Application Priority Data
Sep. 26, 2019  (DE) .............. 10 2019 214 728.3

(51) Int. Cl.
*H05K 7/20* (2006.01)
(52) U.S. Cl.
CPC ............... *H05K 7/20272* (2013.01)
(58) Field of Classification Search
CPC ........... H05K 7/20254; H05K 7/20272; H01L 23/473
See application file for complete search history.

(56) References Cited

U.S. PATENT DOCUMENTS 5,509,468 A * 4/1996 Lopez ................ F28F 3/14
361/689
8,794,301 B2   8/2014 Lundorf
(Continued)

FOREIGN PATENT DOCUMENTS

| CN | 102301502 A | 12/2011 |
| DE | 602005006310 T2 | 5/2009 |

(Continued)

OTHER PUBLICATIONS

International Search Report for PCT/EP2020/076127, Issued Nov. 30, 2020.

*Primary Examiner* — Eric S Ruppert
(74) *Attorney, Agent, or Firm* — NORTON ROSE FULBRIGHT US LLP (57) ABSTRACT

A cooling system having a closed cooling duct system between a main inlet and a main outlet for cooling medium, and includes at least one cooling duct section. The cooling system includes individual modular elements, each including at least one partial segment. In a connecting region of the individual modular elements, their respective at least one partial segment connect continuously to form the at least one cooling duct section. Adjacent individual modular elements each have, in the connecting region, a complementary element of a common media coupling, in which, in a detached connection between two adjacent individual modular elements, the respective partial segment contained in an individual modular element is sealed in media-tight fashion at least in its connecting region, and in a coupled connection between the adjacent individual modular elements, in the connecting region, a passage for a flow of cooling medium is opened inside the media coupling.

14 Claims, 5 Drawing Sheets

(56) References Cited

U.S. PATENT DOCUMENTS

| | | |
|---|---|---|
| 9,016,314 B2 | 4/2015 | Eriksen et al. |
| 10,225,962 B2 | 3/2019 | Uneme et al. |
| 2003/0133257 A1 | 7/2003 | Beihoff et al. |
| 2004/0050231 A1 | 3/2004 | Chu et al. |
| 2011/0302773 A1* | 12/2011 | Chattot ............... H01M 50/296 29/729 |
| 2013/0213605 A1 | 8/2013 | Shi et al. |
| 2013/0284936 A1 | 10/2013 | McBroom et al. |
| 2014/0340847 A1 | 11/2014 | Iwakiri et al. |

FOREIGN PATENT DOCUMENTS

| | | |
|---|---|---|
| DE | 202012012767 U1 | 11/2013 |
| EP | 3054755 A1 | 8/2016 |
| KR | 1020160015615 A * | 2/2016 |

* cited by examiner

COOLING SYSTEM AND COOLING ARRANGEMENT

FIELD

The present invention relates to a cooling system, to an individual modular element as part of the cooling system, and to a cooling installation including the cooling system.

BACKGROUND INFORMATION

In many electronic circuits, electrical and/or electronic components are used that show a measurable temperature increase during operation due to power loss. In particular, due to large internal conductive resistances and/or high operating currents, disadvantageous or impermissible temperature values may be reached, making the operation of the electronic circuit inefficient or endangering its functional safety, in particular over the provided lifespan. For these reasons, a cooling design often has to be provided for regions of the electronic circuit that are at temperature risk. In the case of very high power loss, in many applications cooling is required using a cooling medium inside a cooling device; here, the parts of the electronic circuit that are at temperature risk are then at least indirectly connected to the cooling device, through which the cooling medium flows, for heat dissipation.

An example of an electronic application having in part high power losses is in control devices, in particular in the automotive field. Here, high demands are placed on operational safety, so that cooling is of high importance. Modern vehicle computers communicate internally with one another via a fast bus system (backbone) in the backplane. Due to development, in part rapid, in this field, there is often a need for an update, upgrade, or exchange of equipment in the vehicle, both on the software level and on a hardware level of the electronics. As a result, the need and demand for flexible control device integration is currently increasing in the automotive field.

In the server industry, in case of high power losses, for the purpose of cooling server modules are immersed in a cooling tub filled with an inert cooling medium liquid. These are stationary applications having large dimensions and high weight. Similar power losses will occur in the future in the area of autonomous driving as well. Here, however, there is a lack of solutions that are low in cost and appropriate for the constructive space available in the automotive field and that ensure the dissipation of high power loss while taking into account easy exchangeability of the electronics in order to adapt to the latest state of development.

German Patent Application DE 60 2005 006 310 T2 describes a system in which individual power modules are configured in a stack in a common fluid current. The fluid direction and corresponding openings for the cooling medium run transverse to a flat extension of the power modules and their electrical terminal plane. In addition, each power module provides a partial segment of a common cooling duct for the cooling medium. Exchanging a power module is very complicated, because the system has to be completely disassembled and then reassembled.

For the disassembly, the cooling medium also has to be drained and then refilled after reassembly. Operation of the system without the power module that is to be exchanged is not possible, so that when there is an exchange, long downtimes necessarily result during which the electronic application concerned can no longer be used.

SUMMARY

An object of the present invention includes safely cooling electronics units having high power loss, while enabling fast and simple exchangeability.

This object may be achieved by a cooling system, an individual modular element as part of the cooling system, and a cooling installation including the cooling system, in accordance with example embodiments of the present invention.

The present invention is based on a cooling system having a closed cooling duct system that is fashioned between a main inlet and a main outlet for a cooling medium and includes at least one cooling duct section. The cooling system is made up of two or more individual modular elements, each individual modular element including at least one partial segment of the cooling duct system, or of the at least one cooling duct section. In a connecting region, in particular detachable, of the two individual modular elements to one another, their respectively included at least one partial segment connects continuously to the at least one cooling duct section. In addition, in the connecting region the adjacent individual modular elements each have a complementary element of a common media coupling, in particular as a sealing coupling, in which, in a detached connection between the two adjacent individual modular elements, the respective partial segment contained in an individual modular element is sealed in media-tight fashion at least in its connecting region, and, in a coupled connection between the two adjacent individual modular elements, in the connecting region a passage is opened for a flow of cooling medium inside the media coupling. In this way, an assembly of a plurality of individual modular elements to form the cooling system is made very simple. An existing cooling system can advantageously be adapted in size by adding or removing at least one individual modular element. Advantageously, an adaptation can be made at any time without loss of cooling medium and without the requirement of refilling the cooling medium. In a particular embodiment, at least one of the individual modular elements, or all the individual modular elements, can integrally include an electronics unit that is at least indirectly in thermal contact with the partial segment of the at least one cooling duct section.

In a particularly advantageous specific embodiment of the cooling system of the present invention, the cooling system is fashioned as a base cooling module that includes the at least one cooling duct section as a base cooling duct system. In addition, the base cooling duct system has at least two secondary connections by which the base cooling duct system, outside the base cooling module, can be expanded by a detachable connection with at least one cooling line of an external cooling device. Given such a connection of the cooling line, this line is also preferably connected, or connectable, as a secondary section parallel to a partial segment, formed between the connected secondary connections, of the base cooling duct system. Alternatively, in such a connection two cooling duct sections separate from one another can be connected or connectable to one another in bridged fashion by the cooling line. Advantageously, in this way cooling lines of connected different cooling devices are connected only indirectly, via the base cooling module, in a common cooling duct system that is then expanded, so that individual connected cooling devices can easily be removed from the cooling system, independently of other cooling devices connected in the cooling system, or can be newly incorporated into the cooling system, independently of the other cooling devices. Here, the secondary connections of the base cooling duct system inside the base cooling module are the only interfaces for the cooling medium with respect to a connectable cooling device. In this way, a simple and highly efficient exchangeability of electronics modules within the overall cooling system is enabled, an electronics module having for example an electronics unit, and this unit being at least indirectly in thermal contact with a connectable cooling device as named above. Accordingly, the base cooling module provides a kind of distributor base for a cooling medium for one or more connectable cooling devices, in particular as part of an electronics module. When removing such an individual cooling device, a flow of cooling medium inside the base cooling duct system and in the other cooling devices that may still be connected in the cooling system continues to be easily possible. This is because all the exposed secondary connections merely have to be sealed in media-tight fashion. This can be easily done for example using a sealing element realized for example as a plug or screw closure. Accordingly, the operation of the cooling system, and thus for example the cooling of an electronics unit thermally conductively connected at least indirectly to the cooling system, can be maintained, and downtimes of the associated electronics application can be avoided.

In addition, the base cooling module is a kind of mechanical composite base by which a configuration of connected cooling devices can remain mechanically fixed in the composite. In addition, the provision of the base cooling duct system inside the base cooling module provides the possibility of a modular scaling of a required size of a cooling system. A maximum scaling is determined here by the number of secondary connections provided inside the base cooling duct system. The size of the cooling system can then be adjusted variably, or in a deliberately defined manner, as a function of the number of connected external cooling devices, and thus by the number of cooling lines of the individual external cooling devices that are then additionally connected to the base cooling duct system. The detachable and in particular media-tight connection permits a fast and easy scaling of the cooling system through the incorporation or removal of external cooling devices. Here, any number of conventional solutions are possible, in particular including a force fit and/or positive fit. For example, connection solutions are conceivable in the form of a screw connection, a media-tight plug connection, a spring-supported press-on connection, a coupling connection, and/or in the form of some other detachable realization of the connection. As cooling medium, cooling gases or cooling liquids may be used, in particular cooling water or an inert cooling liquid, if electrical contact with an electronics unit that is to be cooled exists or cannot be excluded due to the provided cooling design. During operation, the cooling system is connected to a media pump via the main inlet and the main outlet, by which a flow of cooling medium inside the cooling system is brought about, for example in the form of a closed cooling circuit. During operation, the cooling medium flows through at least one closed cooling duct section and/or a cooling duct section connected in bridged fashion inside the base cooling module, and, if an external cooling device having corresponding secondary connections is connected, then the cooling medium also flows through its connected cooling line.

In an advantageous specific embodiment of the cooling system, at least one pair of secondary connections is assigned to exactly one, or at least one, continuous cooling duct section, and/or at least one pair of secondary connections is assigned to exactly two, or at least two, cooling duct sections separate from one another, so that the cooling line of at least one external cooling device can be connected, as a parallel secondary section, to the respective at least one assigned cooling duct section, and/or the at least two assigned cooling duct sections separate from one another can be connected to one another in bridged fashion by the cooling line. Preferably, given two separate cooling duct sections, one of the cooling duct sections includes the main inlet and the other includes the main outlet of the cooling system. Further preferably, the two cooling duct sections separate from one another are formed parallel to one another inside the base cooling module, the main inlet and the main outlet in particular each being situated in an end region of the separate cooling duct sections. In principle, the main inlet and the main outlet can then in particular be situated on the same side of the base cooling module, or, alternatively, on opposite sides of the base cooling module. Overall, in this way the possibility is provided of a connection that is easily accessible of the base cooling module to a media pump.

Given a continuous cooling duct section, a plurality of possible parallel secondary sections result, preferably through a continuous configuration of immediately adjacent secondary connections provided so as to run in pairs from the outside to the inside. Further preferably, the at least one continuous cooling duct section is made U-shaped inside the base cooling module, the main inlet and the main outlet being in particular situated on the same side of the base cooling module in the end regions of the continuous cooling duct section. Overall, in this way a high degree of compactness of the cooling system is ensured, even when external cooling devices are connected.

An advantageous specific embodiment of the cooling system of the present invention provides that at least one, or all, individual modular elements has/have exactly two secondary connections that are each connectable to the module inlet and the module outlet of an external cooling device. To this extent, the number of individual modules corresponds exactly to the number of connectable external cooling devices. In this way, the modular design is retained in manufacturing and in handling in a very comprehensible and cost-efficient manner.

In a particular specific embodiment of the cooling system of the present invention, a bridge cooling duct section is formed in at least one or in all individual modular elements, said section opening, inside the individual modular element, into two included partial segments of the at least one cooling duct section. Here, the individual modular element has at least three secondary connections of which respectively two are connectable to an external cooling device, so that the cooling line of the external cooling device is connectable, as a parallel secondary section, to a partial segment of the bridging cooling duct section formed between the connectable secondary connections. In this way, still more external cooling devices can be used in the parallel secondary section connectable to the base cooling duct system, for expansion. Alternatively, an optional connection possibility is provided by which the external cooling devices are connectable with different connection dimensions. Here, connection dimensions are enabled that correspond to the distance between any two secondary connections inside the individual modular element. Overall, in this way the flexibility of the cooling system is further increased.

It is fundamentally advantageous that in order to realize a mechanically held composite body, the individual modular elements are connected to one another with a force fit and/or a positive fit, forming the base cooling module. This can be done in particular by a detachable connecting system including a screw connection, a snap connection, a plug connection, or a clip connection. Other detachable realizations of the connection are also conceivable.

In addition, in an advantageous specific embodiment of the cooling system of the present invention, it is taken into account that the base cooling module has at least one fastening element that is formed as a complementary element of a detachable common fastening system with an external cooling device, for their common, exclusively mechanical, fastening to one another. The fastening system is preferably designed as a screw connection, as a snap connection, as a plug connection, or as a clip connection. Overall, in this way a composite of the base cooling module and one or more connected external cooling devices can also withstand the action of mechanical forces, in particular as at least part of a cooling system of a motor vehicle that is subjected to dynamic forces in many ways.

In a further advantageous specific embodiment of the cooling system of the present invention, the at least two secondary connections each include a flow valve for the cooling medium, the flow valve being designed to, in a first actuation position, open the base cooling duct system for a flow of cooling medium, and in a second actuation position to seal the base cooling duct system in media-tight fashion. Here, the actuation position results as a function of a state of connection to an external cooling device. For this purpose, a respective flow valve can for example have an adjusting element that is spatially configured differently as a function of a state of connection. In the first actuation position, an opening inside the secondary connection is maintained in order to enable a volume flow of the cooling medium, whereas in the detached state, in the second actuation position that is then assumed the opening is sealed by the at least one adjusting element. The first actuation position preferably results from the action of an actuating element as part of a connected external cooling device, and further preferably the second actuation position results from the absence of the action of the named actuating element. It is provided that the respective flow valves of exposed secondary connections of a removed cooling device are in the second actuation position. In this way, in principle the base cooling duct system is sealed in media-tight fashion in the region of all exposed secondary connections. In contrast, in a connection to an external cooling device the respective flow valves of the corresponding secondary connections are in the first actuation position. As result, in principle the base cooling duct system is open for a flow of cooling medium in the region of all connected secondary connections.

In a preferred specific embodiment of the cooling system of the present invention, the flow valves of the secondary connections each have a connecting region for the in particular detachable connection of the base cooling duct system to a cooling line of an external cooling device, the respective connecting region being formed as a complementary element of a common media coupling to the external cooling device, in particular as a sealing coupling. Here, in a coupled connection between the base cooling module and the external cooling device, the first actuation position can be assumed, and in the case of a detached connection between the base cooling module and the cooling device the second actuation position can be assumed. In this way, it is advantageously ensured that a scaling of the cooling system can take place through the addition and/or removal of individual, or a plurality of, external cooling devices at any time without a loss of cooling medium, and without the requirement of refilling the cooling medium. Such sealing couplings are for example also available in garden hose systems;

here, for example a spring-supported plugging system is often used. An open or closed position of the respectively complementary elements can be determined here by a spring force, a magnetic force, or also by an electrical force, in particular as a function of a coupling state of the complementary elements.

The corresponding force acts for example on at least one adjusting element as part of the media coupling.

In a development of the cooling system of the present invention, the secondary connections each have a controllable, in particular electrically controllable, flow valve for adjusting a volume flow of the cooling medium. In this way, a cooling capacity of a connected external cooling device can be adapted to the actual cooling need in a variable or defined manner. In this way, an electronics module containing the cooling device can be operated in a defined operating temperature window.

Overall, in this way there results a more energy-efficient operation of the cooling system, tailored to the particular case of application. In addition or alternatively, for this purpose the base cooling duct system can have partial segments having different cross-sectional dimensions, so that an enabled volume flow of the cooling medium between at least two pairs of secondary connections differs.

The present invention also relates to an individual modular element of a cooling system in at least one of the specific embodiments described above. The individual modular element preferably includes at least one complementary element of a common media coupling of a further individual modular element connectable to the individual modular element, the further element having the fitting other complementary element of the overall media coupling.

The present invention also results in a cooling installation including at least one cooling system according to at least one of the specific embodiments described above. At least two secondary connections are connected to a cooling line of an external cooling device. Preferably, here the cooling device is part of an electronics module having an electronics unit. In at least a partial region, this unit is connected at least indirectly, in thermally conductive fashion, to the cooling device for the dissipation of lost heat. If the connected secondary connections each have the flow valves named above, then, due to the connection, these valves are set to the first actuation position, so that a flow of cooling medium is enabled between the base cooling duct system and the connected cooling line. The same holds for the case in which a media coupling in the coupled state exists between the secondary connections and an external cooling device.

Preferably, the electronics module, including the cooling device, is a power module, for example a control device, in particular for a motor vehicle. Further preferably, the cooling installation is part of a vehicle computer, in particular additionally including a bus system via which electronics modules, preferably in the form of control device, are integrated in an overall system.

BRIEF DESCRIPTION OF THE DRAWINGS

Further advantages, features, and details of the present invention result from the following description of preferred exemplary embodiments of the present invention, and on the basis of the figures.

DETAILED DESCRIPTION OF EXAMPLE EMBODIMENTS

In the Figures, functionally identical components are each identified by the same reference characters.

Figure 1:
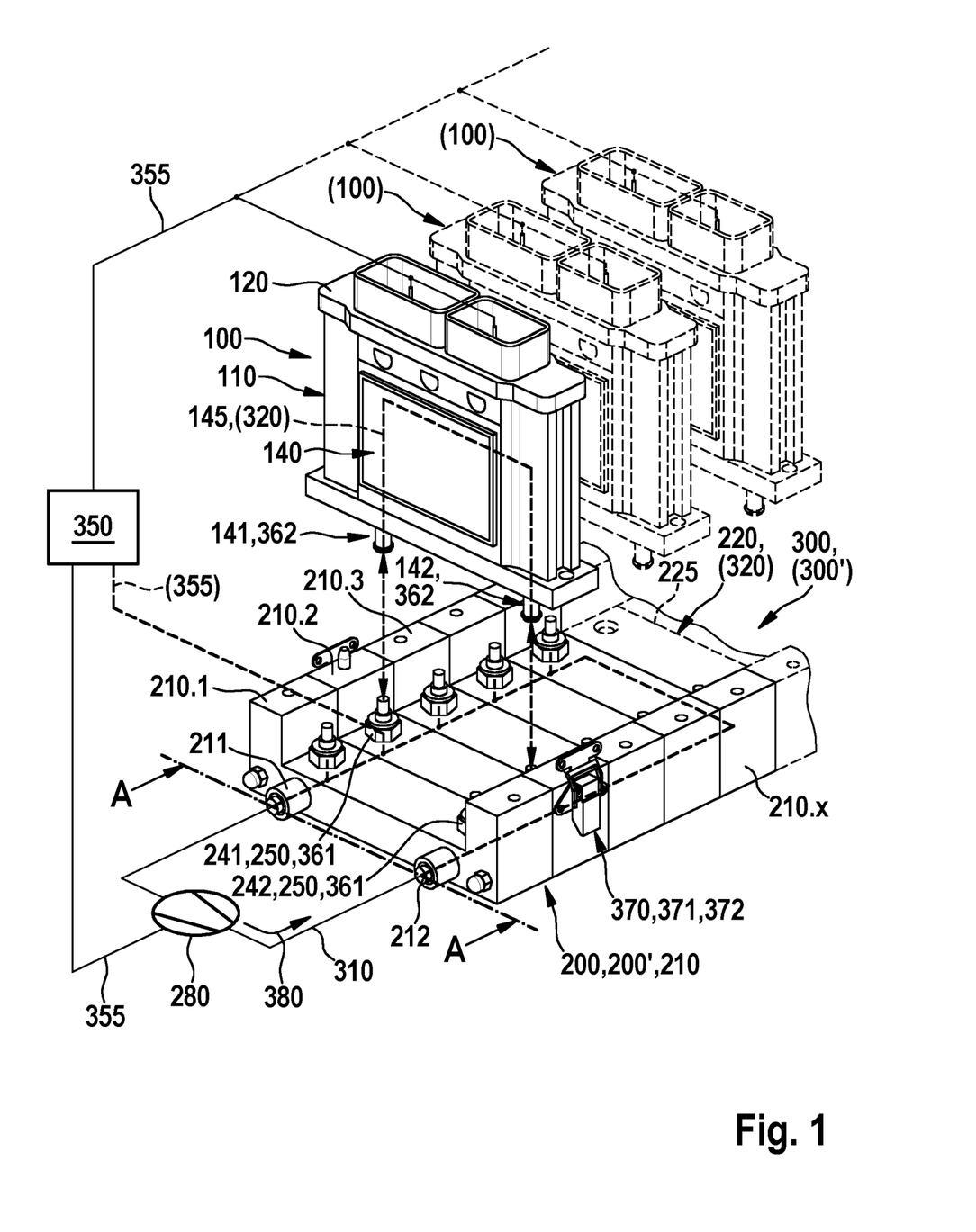
FIG. 1 shows a configuration of a cooling system and at least one electronics module connectable to the cooling system, having an electronics unit and a cooling device, in a perspective view, in accordance with an example embodiment of the present invention.

FIG. 1 shows, in a perspective view, an installation 300 having a cooling system 200 and at least one electronics module 100 that is detached from cooling system 200 but is connectable thereto.

Electronics module 100 has a housing 110 that accommodates an electronics unit in sealed fashion. In addition, electronics module 100 has a cooling device 140 that is connected in thermally conductive fashion to at least a partial region of the electronics unit, for the dissipation of lost heat. Here, a cooling medium 310 that can absorb lost heat from the electronics unit, for example a cooling gas or cooling liquid, flows through cooling device 140. For this purpose, electronics module 100 has a module inlet and a module outlet 141, 142 for cooling medium 310. Between module inlet and module outlet 141, 142, a cooling line 145 of cooling device 140 is formed through which cooling medium 310 is conducted. Given an existing connection of at least one electronics module 100 to cooling system 200, a cooling installation 300' is formed through which a cooling of connected electronics modules 100 by cooling system 200 can take place. Here, cooling medium 310 and the maintenance of a flow of cooling medium through cooling system 200 are provided in a cooling duct system 320 that is sealed as a whole. For this purpose, cooling system 200 is fashioned as a base cooling module 200' having a base cooling duct system 220, and accordingly provides a kind of distributor base for cooling medium 310 for one or more connectable external cooling devices 140, in particular as part of an electronics module 100 as shown in the present exemplary embodiment. Base cooling duct system 220 here includes at least one cooling duct section 225 situated between a main inlet and a main outlet 211, 212 for cooling medium 310. Cooling duct system 320, sealed as a whole, is thus made up of base cooling duct system 220 of base cooling module 200' and each cooling line 145, connected thereto, of an external cooling device, in particular cooling device 140 of an electronics module 100. Accordingly, base cooling duct system 220 is expandable through each connected cooling line 145 of an external cooling device 140. For the connection, base cooling duct system 220 has at least two secondary connections 241, 242. These each have a direct access to the at least one cooling duct section 220. Main inlet 211 and main outlet 212 are connected at least indirectly to a media pump 280 through which a flow of cooling medium through cooling duct system 220 and a connected cooling line 145, for example inside a closed cooling circuit 380, can be maintained. In addition, media pump 280 is for example connected to a control or regulation system 320 for the defined setting of a pump rotational speed. A plug connector 120 of at least one electronics module 100 is for example also electrically connected to control or regulation system 350. The connection of control or regulation system 350 to media pump 280 and/or to at least one electronics module 100 is preferably done by a bus system 355.

Figure 2A:
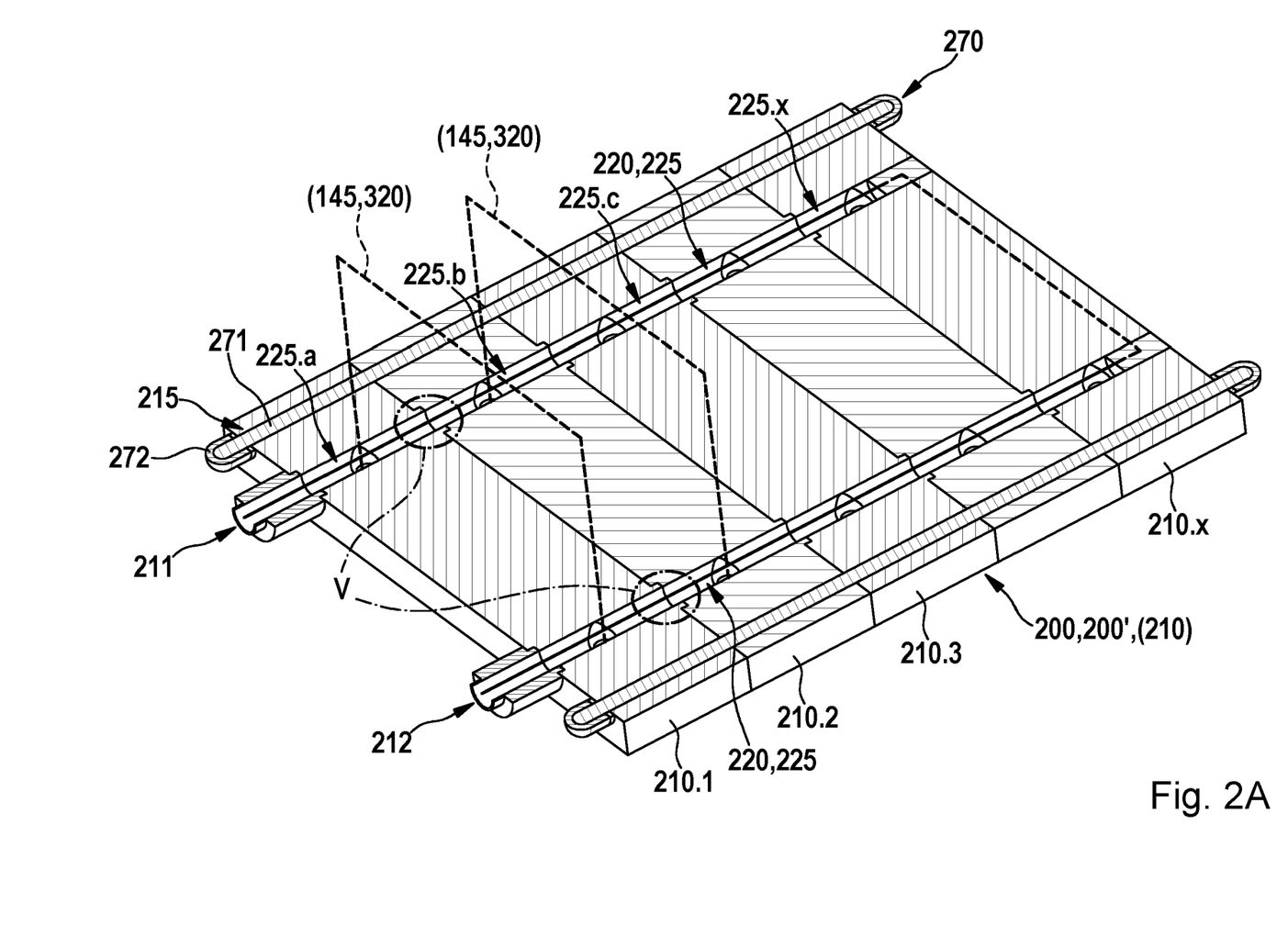
FIG. 2A shows an example of a base cooling duct system of a cooling system, in a perspective view, in accordance with the present invention.

FIG. 2A shows base cooling module 200' in a sectional representation A-A. The sectional plane runs straight through the course of the ducts of base cooling duct system 220. Base cooling duct system 220 can be designed in application-specific fashion in many different ways. In a simple realization, base cooling duct system 220 is formed from two cooling duct sections 225 separate from one another, the main inlet and the main outlet 211, 212 preferably each being situated in an end region of the separate cooling duct sections 225. The inlet and the outlet can then be situated on the same side of base cooling module 200' or on opposite sides of base cooling module 200' (not shown). In another simple realization, at least one continuous cooling duct section 225 is made U-shaped as base cooling duct system 220, inside base cooling module 200' (shown in broken lines). Here, the main inlet and the main outlet 211, 212 are situated on the same side of base cooling module 200' in the end regions of continuous cooling duct section 225.

In general, in all the possible embodiments the at least one pair of secondary connections 241, 242 is assigned to exactly one, or at least one, continuous cooling duct section 225. In this way, cooling lines 145 of external cooling devices 140 are connectable as respectively parallel secondary sections. Alternatively or in addition, the at least one pair of secondary connections 241, 242 can be assigned to exactly two, or to at least two, separate cooling duct sections 225, whereby these sections are connectable to one another in bridged fashion by the cooling line 145 of an external cooling device 140.

Figure 3A:
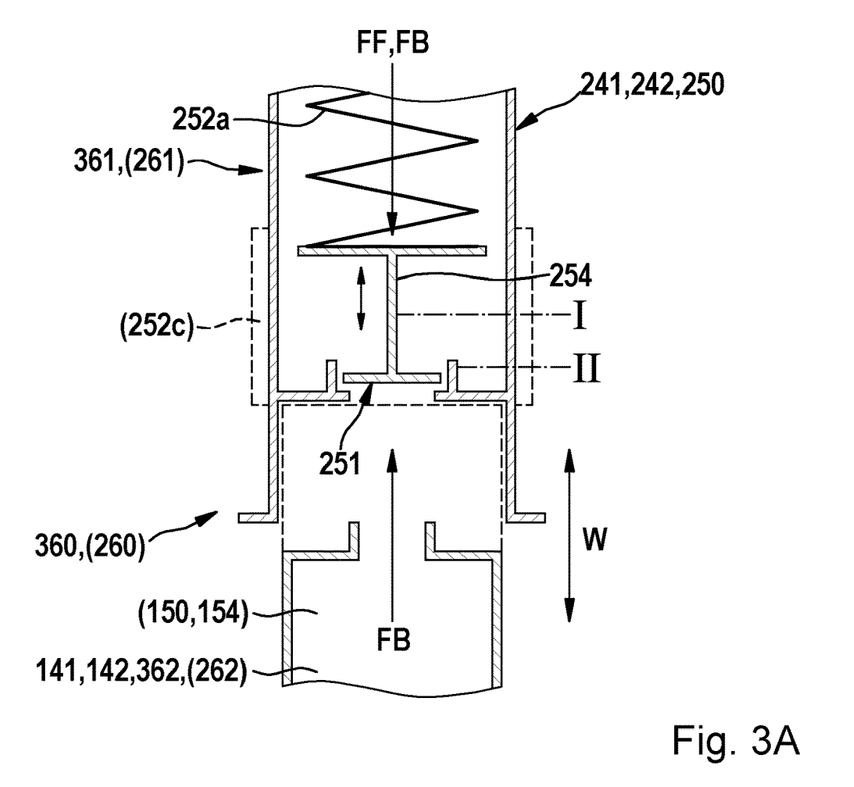
FIG. 3A shows a schematic representation of a flow valve having a spring, in accordance with an example embodiment of the present invention.
Figure 3B:
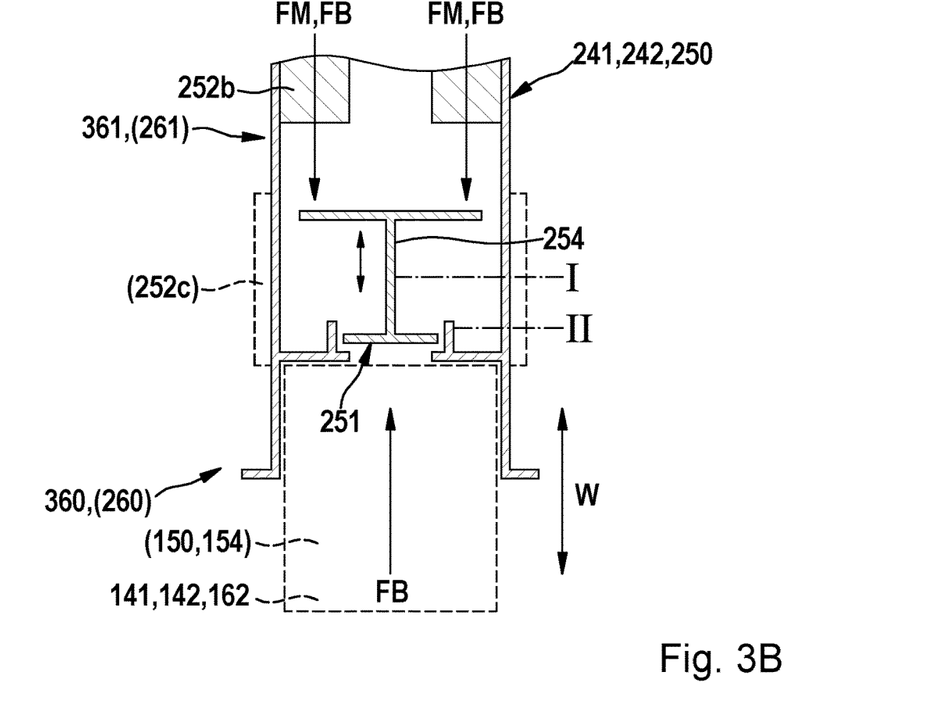
FIG. 3B shows a schematic representation of a flow valve having a magnet, in accordance with an example embodiment of the present invention.
Figure 3C:
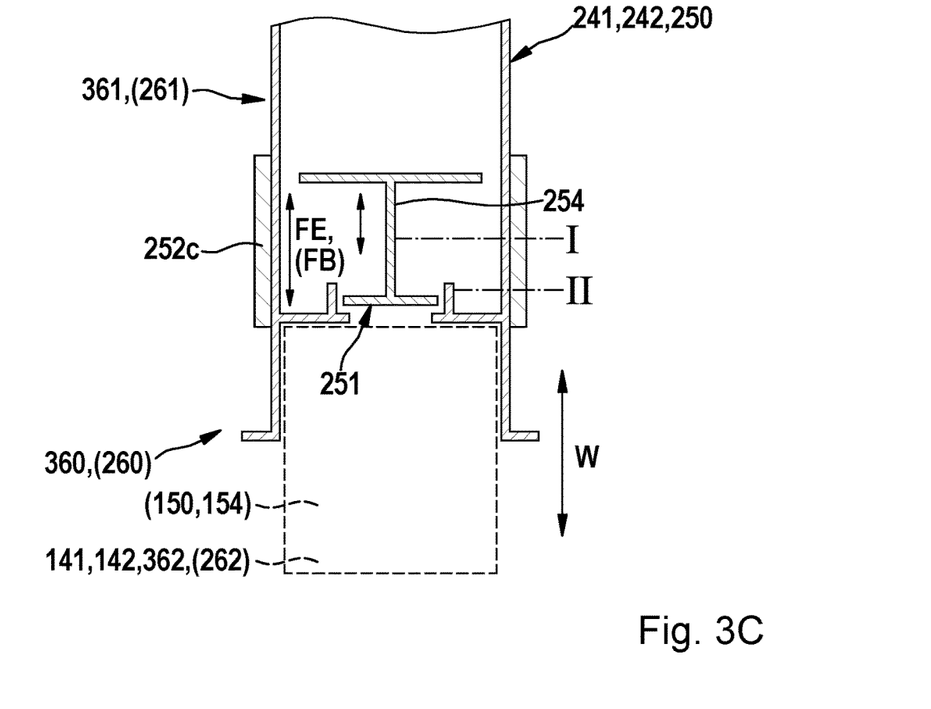
FIG. 3C shows a schematic representation of a flow valve having an electrical coil, in accordance with an example embodiment of the present invention.

Here, a side connection 241, 242 includes, or presents, in each case a flow valve 250 for cooling medium 310. Flow valve 250 is fashioned to open base cooling duct system 220 for the flow of cooling medium in a first actuation position I, and to close base cooling duct system 220 in media-tight fashion in a second actuation position II. In principle, such a flow valve 250 can be realized with different designs. FIGS. 3A - 3C schematically show preferred design solutions. They all have in common that flow valve 250 has at least one adjusting element 254 that can assume various spatial positions through an actuating force FB. At least in the first actuating position I, it here assumes a spatial position inside flow valve 250 in which an opening 251 inside the respective side connection 241, 242 is maintained in order to enable a volume flow of cooling medium 310. In contrast, in second actuation position II the opening is blocked, i.e. sealed in completely media-tight fashion, by adjusting element 254. FIG. 3A shows a schematic example design in which first and second actuating position I, II are determined by a spring force FF of a spring 252a. If, in a base position, only spring force FF facts as actuating force FB on displaceable adjusting element 254, then for example the second actuating position 2 is assumed. If a further, larger actuating force FB acts on adjusting element 254 opposite spring force FF, then the element moves into first actuation position I. Such a counter-force to spring force FF is produced for example by a connecting region 141, 142 of an external cooling device 140 in the function of an actuating element that acts externally on adjusting element 254 through a joining movement W in the connection with a secondary connection 241, 242. In FIG. 3B, a similar embodiment is shown, but here instead of spring 252a a magnet 252b is used. Here, the base position is brought about solely by the action of magnetic force FM on adjusting element 254. Comparable to FIG. 3A, the counter-force due to connecting element 241, 242 of external cooling device 140 can then position adjusting element 254 into the other actuation position. FIG. 3C shows a further embodiment in which the positioning of adjusting element 254 in the two actuation positions I, II is brought about by an electrical force FE as actuating force FB. Electrical force FE is produced here by an electrical coil 152c situated in flow valve 250 that, as a function of the current, brings about a force component FE directed onto adjusting element 254. In connection with connection region 141, 142 of external cooling device 140, a switching condition for electrical coil 252c can be created, for example through an electrical contact, in order to bring about the release for actuation position I. In general, actuation positions I, II can also be realized in directly rotated fashion, as described above.

Accordingly, the actuation position preferably results as a function of a state of connection of cooling system 200 to an external cooling device 140, in particular as part of an electronics module 100. At least one of the actuation positions I, II results in particular through the action of an actuating element 141, 142 as part of a connected external cooling device 140, and, further preferably, in addition the other actuation position I, II then results from the absence of the action of the named actuating element 141, 142. Overall, in this way a common media coupling 360 is preferably formed, in particular as a sealing coupling. Here, the connection region of a secondary connection 241, 242 and the corresponding connection region 141, 142 of external cooling device 140 each form complementary elements 361, 362 of media coupling 360, such that in a coupled connection first actuation position I is assumed, and when there is a detached connection second actuation position II is assumed. Module inlet and module outlet 141, 142 of external cooling device 140 can each have a flow valve 150, in a manner similar to secondary connections 241, 242, and/or can have their own adjusting element 154 that can be configured in a plurality of spatial positions.

The embodiments can also include that at least one of the named adjusting elements 154, 254 is additionally controllable in its spatial positioning in order to adjust the volume flow of cooling medium 310 for a connected cooling device 140, in particular as part of an electronics module 100, in a defined manner, in particular in order to meet a particular need. For example, for this purpose the already-named coil 152c can be used. In principle, this can also take place for a different, further adjusting element than that shown. For this purpose, a connected electronics module 100 for example has a control or regulating electronics unit. This also includes a temperature sensor that is for example situated on a circuit board in a temperature-identifying region. Here, the control or regulating electronics unit generates, as a function of an acquired temperature value, a control or regulating variable through which a position of adjusting element 154, 254 can be adjusted between actuation position I and II, in particular for the operation of electronics module 100 within a defined operating temperature range. Alternatively, the respective electronics module 100 can be connected, via an external connection or plug connector 120, to a higher-level control or regulating system 350 relative to electronics module 100, said system taking over the controlling, or regulation, of adjusting element 154, 254, or bringing about the generation of the control or regulating variable. For this purpose, the electrically controllable adjusting elements 254 of base cooling module 200' can also be connected to control or regulating system 350 via bus system 355.

Base cooling module 200' is designed for the flexible expansion of base cooling duct system 220 in modular fashion, from at least two or more individual modular elements 210.1, 210.2, 210.3, 210.x. Each individual modular element 210.1, 210.2, 210.3, 210.x includes at least one partial segment 225.a, 225.b, 225.c, 225.x of the at least one cooling duct section 225. In an in particular detachable connection region V of two immediately adjoining individual modular elements 210.1, 210.2, 210.3, 210.x, their respectively included at least one partial segment 225.a, 225.b, 225.c, 225.x is continuously connected to the at least one cooling duct section 225. So that the individual modular elements 210.1, 210.2, 210.3, 210.x in the composite are held mechanically in fixed fashion, forming base cooling module 200', they are connected with a force fit and/or with a positive fit to one another by an in particular detachable connecting system 270. A possibility for this is for example a screw connection, in particular including at least one threaded rod 271 that passes through a fastening opening 215 in all the individual modular elements 210.1, 210.2, 210.3, 210.x that are to be held together. By counternuts in the end regions of threaded rod 271, the individual modular elements 210.1, 210.2, 210.3, 210.x situated in between are tensioned against one another and fixed. Alternatively, individual modular elements 210.1, 210.2, 210.3, 210.x can also be fastened by a respective snap connection, plug connection, or clip closure in the connecting region (not shown). Likewise, electronics module 100 is additionally fastened to at least one individual modular element 210.1, 210.2, 210.3, 210.x. For this purpose, electronics module 100, and the at least one individual modular element 210.1, 210.2, 210.3, 210.x, each have complementary elements 371, 372 of a common, in particular detachable, fastening system 370 that are brought together in an effective configuration. Fastening system 370 is for example a screw connection, a snap connection, a plug connection, or a clip closure.

In the respective connection region V, the directly continuously connected partial segments 225.a, 225.b, 225.c, 225.x are sealed from one another. In this way, a loss of cooling medium in the composite of individual modular elements 210.1, 210.2, 210.3, 210.x is prevented.

Figure 2B:
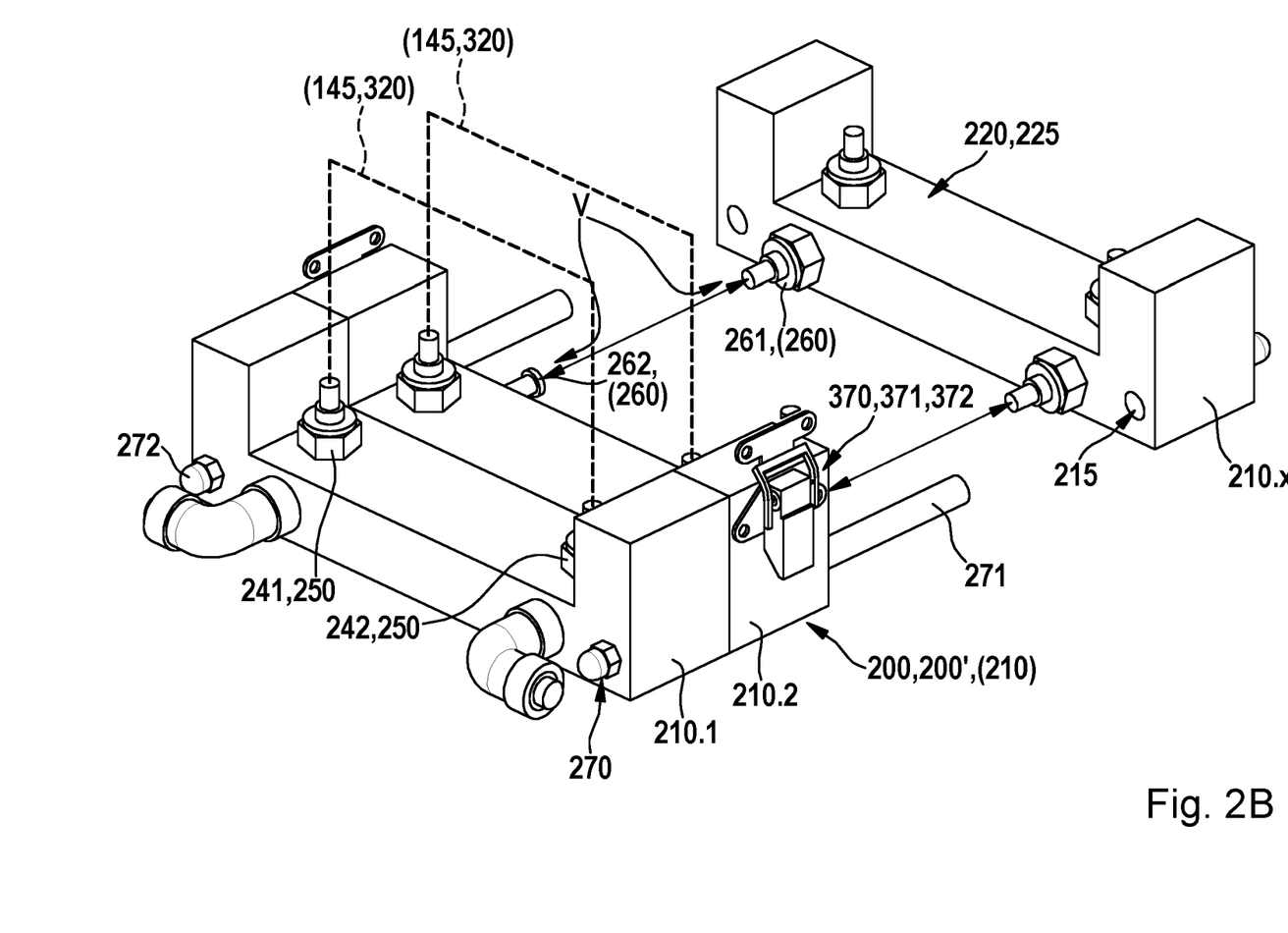
FIG. 2B shows an exemplary embodiment of a modular cooling system in a perspective view, in accordance with the present invention.

FIG. 2B shows two individual modular elements 210.1, 210.2, 210.3, 210.x in a detached perspective view. In principle, two immediately adjacent individual modular elements 210.1, 210.2, 210.3, 210.x in connecting region V each have a complementary element 261, 262 of a common media coupling 260, in particular as a sealing coupling. Here, in a detached connection between two adjacent individual modular elements 210.1, 210.2, 210.3, 210.x, the respective partial segment 225.a, 225.b, 225.c, 225.x contained in an individual modular element 210.1, 210.2, 210.3, 210.x is sealed in media-tight fashion at least in its connecting region V. In a coupled connection between two adjacent individual modular elements 210.1, 210.2, 210.3, 210.x, in contrast, in connecting region V a passage is opened for a flow of cooling medium inside media coupling 260. Here, the realization of media coupling 260 can correspond to media coupling 360 as described above in FIGS. 3A - 3B, in connection with the connecting region of a secondary connection 241, 242 and the corresponding connecting region 141, 142 of external cooling device 140.

Figure 2C:
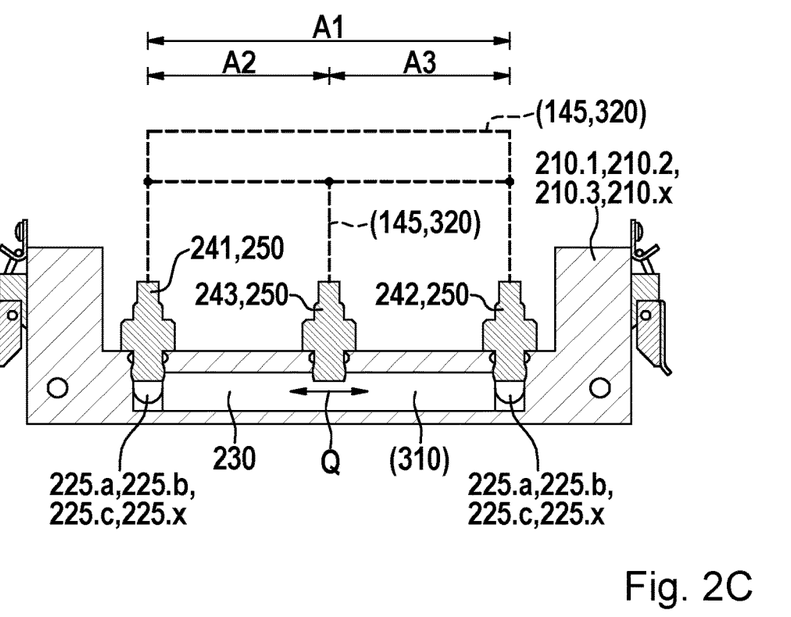
FIG. 2C shows an individual modular element having a bridging cooling duct section, shown in a sectional view through the included flow valves, in accordance with an example embodiment of the present invention.

FIG. 2C shows another possible embodiment of an individual modular element 210.1, 210.2, 210.3, 210.x in which a bridging cooling duct section 230 is formed that connects two included partial segments 225.a, 225.b, 225.c, 225.x to one another in the region of two also included secondary connections 241, 242. In this way, a cross-flow Q of cooling medium 310 inside bridging cooling duct section 230 is enabled. In addition, between the two secondary connections 241, 242 there is situated at least one further secondary connection 243, that has/have a direct media access to bridging cooling duct section 230. Here, in addition to a first possible connection A1 of an external cooling device 140 as parallel secondary section of a cooling line 145, as in the embodiments shown previously, there is in addition also a second and third possible connection A2, A3, and, given further secondary connections, there are still more. Here, possible connections A1, A2, A3 can offer different connection dimensions for the connection of external cooling device 140.

What is claimed is:

1. A cooling system having a closed cooling duct system formed between a main inlet and a main outlet for a cooling medium, the cooling system including at least one cooling duct section, the cooling system comprising:
two or more individual modular elements, each of the individual modular elements including at least one partial segment of the at least one cooling duct section, wherein, in a connecting region of the two or more individual modular elements, the at least two or more individual modular elements are detachably connected to one another, and wherein, in the connecting region, each of the at least one partial segment of the two or more individual modular elements continuously connect to one another to form the at least one cooling duct section;
wherein adjacent ones of the individual modular elements each have, in the connecting region, a complementary element of a common media coupling, the media coupling being a sealing coupling, wherein in a detached connection between the adjacent individual modular elements, the partial segment contained in the adjacent individual modular elements are sealed in media-tight fashion at least in the connecting region, and in a coupled connection between the adjacent individual modular elements, in the connecting region, a passage is open for a flow of cooling medium inside the media coupling,
wherein the cooling system has at least two secondary connections, each having an electrically controllable or regulable flow valve for adjusting a volume flow of the cooling medium, wherein a cooling capacity of a connected external cooling device is adapted to an actual cooling need in a variable or defined manner.

2. The cooling system as recited in claim 1, wherein the cooling system is a base cooling module that includes the at least one cooling duct section as a base cooling duct system, the base cooling duct system having at least two secondary connections by which the base cooling duct system is expandable outside the base cooling module through a detachable connection with at least one cooling line of an external cooling device.

3. The cooling system as recited in claim 2, wherein the at least one pair of secondary connections are assigned to exactly one, or at least one, continuous cooling duct section of the base cooling duct system, and/or at least one pair of secondary connections are assigned to exactly two, or at least two, cooling duct sections that are separate from one another, so that the cooling line of at least one external cooling device is connectable, as a parallel secondary section, to the assigned cooling duct section, and/or the at least two assigned cooling duct sections separate from one another are connectable to one another in bridging fashion by the cooling line.

4. The cooling system as recited in claim 2, wherein the base cooling duct system includes exactly one, or at least one, cooling duct section that is formed in U-shaped fashion inside the cooling system, the main inlet and the main outlet being situated on the same side of the cooling system in end regions of the cooling duct section.

5. The cooling system as recited in claim 2, wherein the base cooling duct system includes two cooling duct sections separate from one another that are formed parallel to one another inside the cooling system, the main inlet and the main outlet each being situated in an end region of the separate cooling duct sections, and the main inlet and the main outlet being situated on the same side of the cooling system or on opposite sides of the cooling system.

6. The cooling system as recited in claim 2, wherein at least one, or all of the individual modular elements has exactly two secondary connections.

7. The cooling system as recited in claim 1, wherein, to bring about a mechanically held composite body, the individual modular elements are connected to one another with a force fit and/or with a positive fit.

8. The cooling system as recited in claim 2, wherein the base cooling module has at least one fastening element that is fashioned as a complementary element of a detachable common fastening system with the external cooling device for a common exclusively mechanical fastening thereof to one another, the fastening system being a screw connection or a snap connection or a plug connection or a clip closure.

9. The cooling system as recited in claim 2, wherein the at least two secondary connections each include a flow valve for the cooling medium, the flow valve being configured to open for a flow of cooling medium in a first actuation position of the base cooling duct system, and to seal the base cooling duct system in media-tight fashion in a second actuation position.

10. The cooling system as recited in claim 9, wherein the flow valves of the secondary connections each have a connecting region for a detachable connection of the base cooling duct system to the cooling line of the external cooling device, each connecting region being formed as a complementary element of a common media coupling with the external cooling device, as a sealing coupling, in which, in a coupled connection between the base cooling module and the external cooling device, the first actuation position is assumed, and in a detached connection between the base cooling module and the cooling device, the second actuation position is assumed.

11. The cooling system as recited in claim 10, wherein the first and second actuation positions are determined by a spring force or a magnetic force or an electrical force, as a function of a coupling state with the complementary element of the external cooling device.

12. A cooling system having a closed cooling duct system formed between a main inlet and a main outlet for a cooling medium, the cooling system including at least one cooling duct section, the cooling system comprising:
- two or more individual modular elements, each of the individual modular elements including at least one partial segment of the at least one cooling duct section, wherein, in a connecting region of the two or more individual modular elements, the at least two or more individual modular elements are detachably connected to one another, and wherein, in the connecting region, each of the at least one partial segment of the two or more individual modular elements continuously connect to one another to form the at least one cooling duct section;
- wherein adjacent ones of the individual modular elements each have, in the connecting region, a complementary element of a common media coupling, the media coupling being a sealing coupling, wherein in a detached connection between the adjacent individual modular elements, the partial segment contained in the adjacent individual modular elements are sealed in media-tight fashion at least in the connecting region, and in a coupled connection between the adjacent individual modular elements, in the connecting region, a passage is open for a flow of cooling medium inside the media coupling,
- wherein the cooling system is a base cooling module that includes the at least one cooling duct section as a base cooling duct system, the base cooling duct system having at least two secondary connections by which the base cooling duct system is expandable outside the base cooling module through a detachable connection with at least one cooling line of an external cooling device,
- wherein in each individual modular element of at least one, or in all, of the individual modular elements, there is formed a respective bridging cooling duct section that, inside the individual modular element, opens into two included partial segments of the at least one cooling duct section of the base cooling duct system, the individual modular element having at least three secondary connections of which respectively two are connectable to a module inlet and to a module outlet of an external cooling device, so that the cooling line of the external cooling device is connectable as a parallel secondary section to a partial segment, formed between the connectable secondary connections, of the bridging cooling duct section.

13. An individual modular element of a cooling system, the cooling having a closed cooling duct system formed between a main inlet and a main outlet for a cooling medium, the cooling system including at least one cooling duct section, the individual modular element comprising:
- at least one partial segment of the at least one cooling duct section, wherein, the individual modular element is detachably connectable with an adjacent individual modular element in a connecting region, wherein, in the connecting region, the at least one partial segment of the individual modular element is continuously connected to at least one partial segment of the adjacent individual modular element to form the at least one cooling duct section;
- wherein the individual modular element has, in the connecting region, a complementary element of a common media coupling, the media coupling being a sealing coupling, wherein in a detached connection between the individual modular element with the adjacent individual modular element, the partial segment contained in the individual modular element is sealed in media-tight fashion at least in the connecting region, and in a coupled connection between the individual modular element with the adjacent individual modular element, in the connecting region, a passage is open for a flow of cooling medium inside the media coupling,
- wherein the secondary connections each have an electrically controllable or regulable flow valve for adjusting a volume flow of the cooling medium, wherein a cooling capacity of a connected external cooling device is adapted to an actual cooling need in a variable or defined manner.

14. A cooling installation, comprising:
- at least one cooling system having a closed cooling duct system formed between a main inlet and a main outlet for a cooling medium, the cooling system including at least one cooling duct section, the cooling system including:
  - two or more individual modular elements, each of the individual modular elements including at least one partial segment of the at least one cooling duct section, wherein, in a connecting region of the two or more individual modular elements, the at least two or more individual modular elements are detachably connected to one another, and wherein, in the connecting region, each of the at least one partial segment of the two or more individual modular elements continuously connect to one another to form the at least one cooling duct section,
  - wherein adjacent ones of the individual modular elements each have, in the connecting region, a complementary element of a common media coupling, the media coupling being a sealing coupling, wherein in a detached connection between the adjacent individual modular elements, the partial segment contained in the adjacent individual modular elements are sealed in media-tight fashion at least in the connecting region, and in a coupled connection between the adjacent individual modular elements, in the connecting region, a passage is open for a flow of cooling medium inside the media coupling, and
  - wherein the cooling system is a base cooling module that includes the at least one cooling duct section as a base cooling duct system, the base cooling duct system having at least two secondary connections by which the base cooling duct system is expandable outside the base cooling module through a detachable connection with at least one cooling line of an external cooling device;
- wherein the at least two secondary connections are connected to the cooling line of the external cooling device,
- wherein the secondary connections each have an electrically controllable or regulable flow valve for adjusting a volume flow of the cooling medium, wherein a cooling capacity of a connected external cooling device is adapted to an actual cooling need in a variable or defined manner.

* * * * *